United States Patent [19]
Okunuki et al.

[11] Patent Number: 4,897,552
[45] Date of Patent: Jan. 30, 1990

[54] MULTI-ELECTRON-BEAM PATTERN DRAWING APPARATUS

[75] Inventors: Masahiko Okunuki, Tokyo; Isamu Shimoda, Zama; Mamoru Miyawaki, Tokyo; Takeo Tsukamoto, Atsugi; Akira Suzuki; Tetsuya Kaneko, both of Yokohama; Toshihiko Takeda, Tokyo; Mitsuaki Seki, Machida, all of Japan

[73] Assignee: Canon Kabushiki Kaisha, Tokyo, Japan

[21] Appl. No.: 186,967

[22] Filed: Apr. 27, 1988

[30] Foreign Application Priority Data

Apr. 28, 1987 [JP] Japan ................................ 62-103027
Apr. 28, 1987 [JP] Japan ................................ 62-103028
Apr. 28, 1987 [JP] Japan ................................ 62-103038

[51] Int. Cl.⁴ ............................................. G21K 5/10
[52] U.S. Cl. ................. 250/492.2; 250/396 R; 250/398; 250/397; 250/492.3
[58] Field of Search ............... 250/492.2, 492.3, 397, 250/396 R, 398

[56] References Cited

U.S. PATENT DOCUMENTS 4,259,678  3/1981  Van Gorkom et al. ............. 357/55
4,418,283  11/1983  Trotel ................................. 250/398
4,810,889  3/1989  Yokomatsu et al. ............. 250/492.2

Primary Examiner—Carolyn E. Fields
Assistant Examiner—John A. Miller
Attorney, Agent, or Firm—Fitzpatrick, Cella, Harper & Scinto

[57] ABSTRACT

A charged-particle beam pattern drawing apparatus for drawing, by use of a charged-particle beam, a desired circuit pattern on a workpiece having a surface coated with a sensitive material, is disclosed. The apparatus includes a data source having data stored therein related to the circuit pattern, a plurality of charged-particle beam producing sources for emitting charged-particle beams toward the workpiece, in accordance with the data supplied thereto from the data source, and a plurality of deflecting electrodes each being provided for a corresponding one of the charged-particle beam producing source, for deflecting the charged-particle beams from the charged-particle beam producing sources independently of each other and in accordance with the data supplied from the data source.

8 Claims, 6 Drawing Sheets

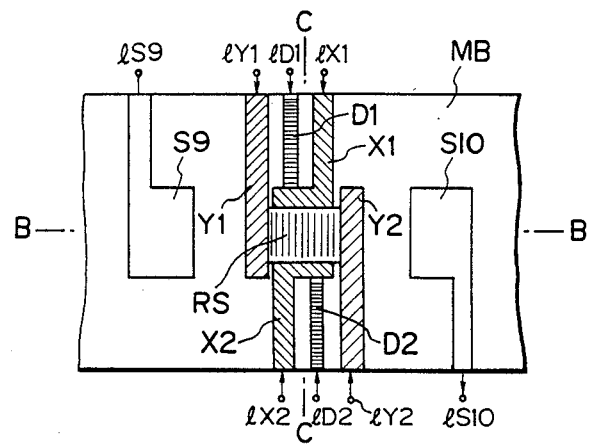
F I G. 2A
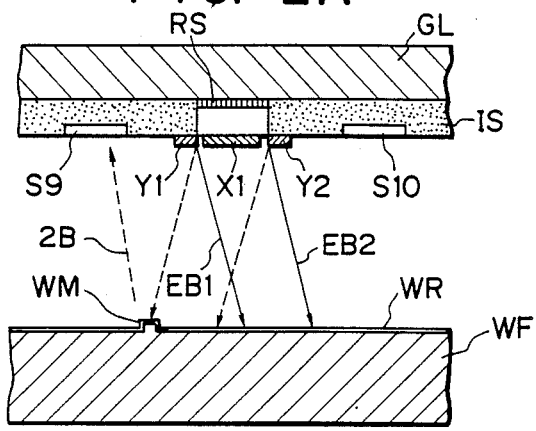
F I G. 2B
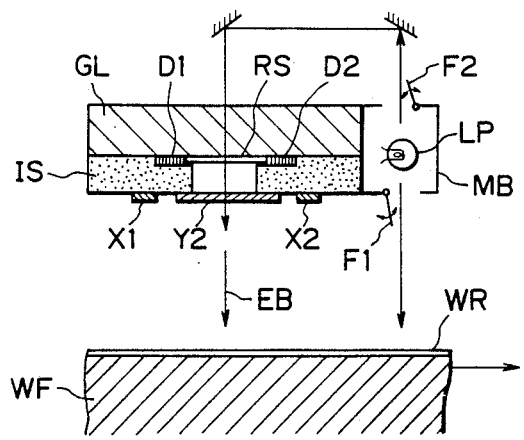
F I G. 2C

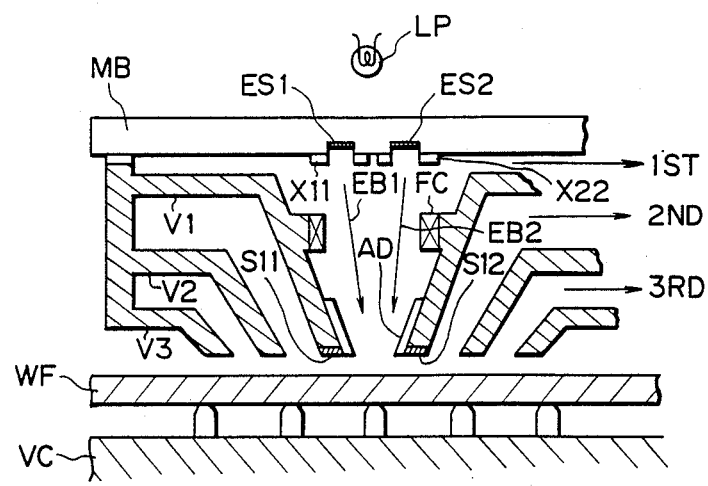
F I G. 3
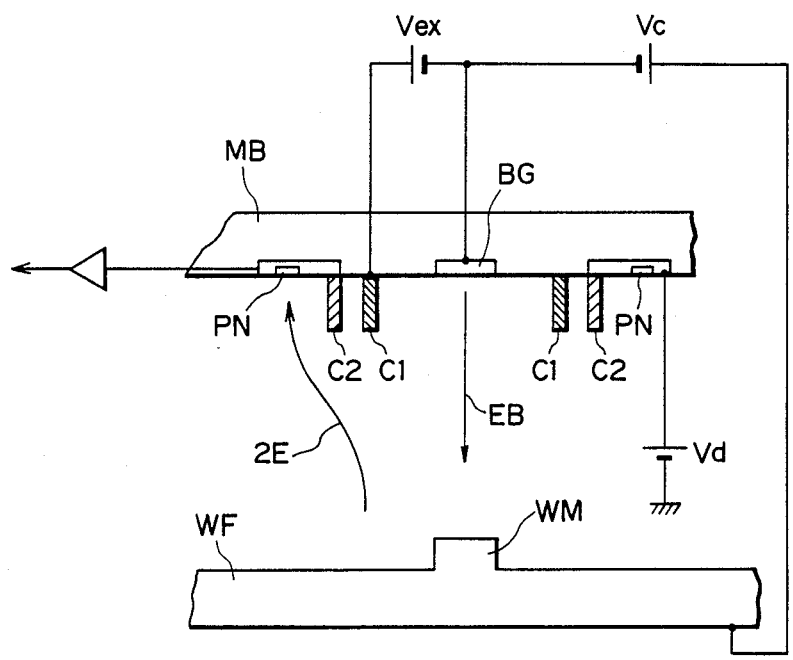
F I G. 4

MULTI-ELECTRON-BEAM PATTERN DRAWING APPARATUS

FIELD OF THE INVENTION AND RELATED ART

This invention relates to an electron beam pattern drawing apparatus usable in the manufacture of semiconductor microcircuits and, more particularly, to a multi-electron-beam pattern drawing apparatus which includes a plurality of electron emitting sources. The present invention is applicable also to a charged-particle pattern drawing apparatus using charged particles such as ions, other than electrons.

Conventionally, efforts have been made to develop a multi-electron-beam pattern drawing apparatus wherein a plurality of electron producing sources are provided and electron flows emitted from these electron producing sources are focused and deflected, as desired, by suitable focusing and deflecting means, provided separately from the electron producing sources, whereby a desired circuit pattern is drawn on a semiconductor wafer.

Traditional electron emitting sources utilize emission of thermoelectrons from a hot cathode. However, these types of electron emitting sources involve problems of a large loss in energy due to heating, the necessity of provision of heating means, unstableness due to the use of heat, bulkiness which easily results in complication of the pattern drawing apparatus including plural electron emitting sources, and so on.

In consideration of such inconveniences, studies have been made to develop an electron emitting source that does not rely on heating, but utilizes electron emission from a cold cathode, and various proposals and reports have been made. Examples of such an electron emitting source are as follows:

(1) An electron emitting element of the type that an inverse bias voltage is applied to a p-n junction to cause avalanche breakdown whereby electrons are emitted out of the element. This type of electron emitting element is disclosed in U.S. Pat. No. 4,259,678 and Japanese Laid-Open Patent Application, Laid-Open No. Sho54-111272.

(2) An MIM type electron emitting element wherein a layered structure of metal-insulator-metal is provided and wherein an electric voltage is applied between two metal layers, whereby electrons passed through the insulating layer due to the tunnel effect are emitted from the metal layer to the outside of the element.

(3) A surface conduction type electron emitting element wherein an electric voltage is applied to a high-resistance thin film in a direction perpendicular to the film direction, whereby electrons are emitted from the surface of the thin film to the outside of the element.

(4) A field-effect type (FE type) electron emitting element wherein an electric voltage is applied to a metal member having such a shape that easily causes the electric field concentration, so that a high-density electric field is produced locally, whereby electrons are emitted from the metal member to the outside of the element.

It has been considered to incorporate, into an electron beam pattern drawing apparatus and as a charged-particle producing source means, a plurality of electron emitting elements of the type wherein the emission of electrons from a cold cathode is utilized as described hereinbefore. In such an apparatus, more specifically, the emission of electrons from the electron producing sources may be selectively controlled so that the electrons are emitted patternwise, as desired, the emitted electrons impinging upon the surface of a workpiece such as a wafer, whereby a desired circuit pattern can be drawn on the workpiece by means of the electron beam exposure. Since the electron producing source means of the type described just above can be made compact, use of plural electron producing source means such as above in a multi-electron beam pattern drawing apparatus will be effective to reduce the size of the apparatus.

SUMMARY OF THE INVENTION

Conventional electron beam pattern drawing apparatuses include focusing means and deflecting means for focusing and deflecting an electron beam emitted from an electron beam producing source. These focusing means and deflecting means are separated from the electron beam producing means. This is a bar to the reduction in size of the pattern drawing apparatus and also to the simplification of the structure thereof.

Further, when a workpiece such as a semiconductor wafer is deformed (e.g. expanded or contracted) due to temperature change, the heat treatment or other processings, there occurs an error or difference between the actual size of each chip and the pattern drawing range as determined by the predetermined circuit pattern data (design data). If this occurs, in conventional pattern drawing apparatuses, it is not possible to draw a desired circuit pattern exactly on each chip of a wafer.

Accordingly, it is an object of the present invention to provide a charged-particle beam pattern drawing apparatus by which at least one of the abovedescribed problems can be solved.

It is another object of the present invention to provide a charged-particle beam pattern drawing apparatus having a simple and compact structure and allowing efficient and precise beam irradiation, effectively assuring manufacture of highly integrated circuit patterns.

Briefly, in accordance with one aspect of the present invention, to achieve at least one of the above objects, there is provided a charged-particle beam pattern drawing apparatus wherein a plurality of charged-particle beam producing sources and a plurality of deflecting means, each being effective to deflect a charged-particle beam emitted from a corresponding beam producing source, independently of the other deflecting means, are provided on a single and common base member. These charged-particle beam producing sources and deflecting means are operated in accordance with the data concerning a pattern to be formed on a workpiece, whereby charged-particle beams are projected upon the workpiece accordingly. Use of the plural charged-particle beam producing sources in the described manner allows irradiation of plural regions on the workpiece, at the same time and in parallel to each other. Thus, the processing speed (exposure speed) can be increased significantly. Further, the provision of these beam producing sources and their deflecting means on a single and common base member is effective to reduce the size of the apparatus and, also, ensures improved manufacturing accuracy of the apparatus. Additionally, the provision of one deflecting means for each charged-particle beam producing source is effective to enlarge the region which is covered (which can be exposed) by each charged-particle beam producing source. Also, this arrangement allows accurate correction of the direction of projection of a beam from each beam producing source.

In accordance with another aspect of the present invention, there is provided a charged particle beam apparatus for irradiating a sensitive member with a charged-particle beam in accordance with data concerning a pattern to be formed on the sensitive member, wherein two or more data storing means are provided so that the pattern data is applied to the charged-particle beam producing source while alternately using the plural data storing means.

With this arrangement, during a time period during which the pattern data is transferred from one data storing means to the charged-particle beam producing source, different pattern data can be transferred to another data storing means. Thus, the charged-particle beam producing source can be supplied with various pattern data without interruption.

In accordance with a further aspect of the present invention, different regions of a sensitive member (workpiece) are irradiated with charged-particle beams emitted from plural charged-particle beam producing sources, the emission of the beams being made on the basis of pattern data supplied to the beam producing sources from a data source. This ensures simultaneous transfer of data to the different charged-particle beam producing sources from the data source, such that the different regions can be irradiated with the charged-particle beams at the same time or in parallel to each other. Namely, the throughput can be improved significantly. Further, in the present invention, each region can be irradiated with a charged-particle beam emitted from one charged-particle beam producing source. This is effective to avoid the problem of heat generation or interference.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A-2C show an example of an electron beam head usable in the electron beam apparatus of the FIG. 1 embodiment, wherein FIG. 2A is a bottom view, FIG. 2B is a section taken on a line B—B in FIG. 2A, and FIG. 2C is a section taken on a line C—C in FIG. 2A.

FIGS. 3 and 4 are fragmentary sections, respectively, schematically showing other forms of electron beam heads usable in the electron beam apparatus of the FIG. 1 embodiment.

DESCRIPTION OF THE PREFERRED EMBODIMENTS

Figure 1:
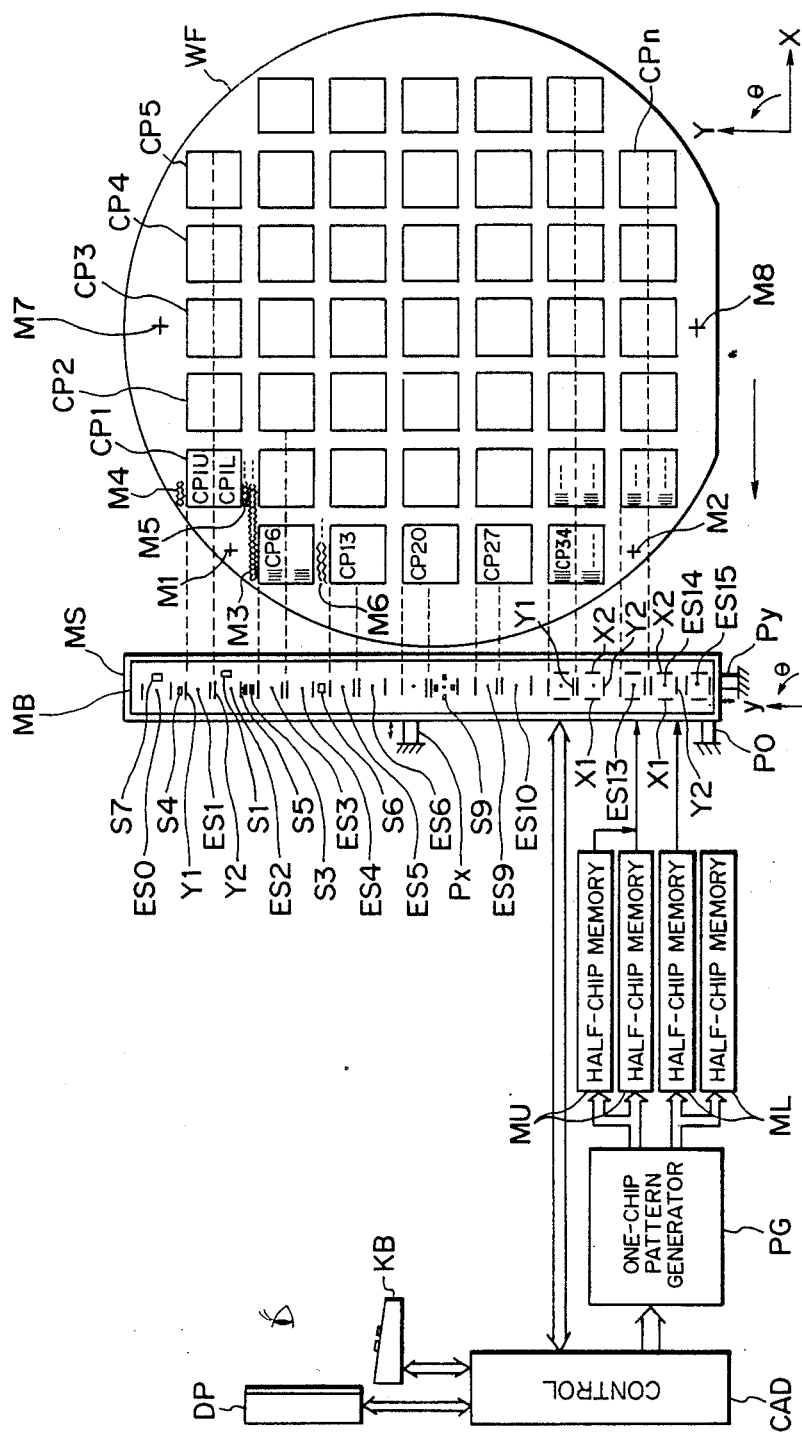
FIG. 1 is a schematic view of an electron beam apparatus according to a first embodiment of the present invention, wherein the electron beam apparatus is applied to the exposure of a semiconductor wafer.

Referring first to FIG. 1, there is schematically shown a multi-electron-beam pattern drawing apparatus according to a first embodiment of the present invention. In this embodiment, the invention is applied to a case where electron beams emitted from plural electron sources are deflected and scanned so that desired circuit patterns are drawn on different chips, respectively.

In FIG. 1, reference character WF denotes a wafer which is placed on an X-Y-$\theta$ stage (not shown) and which is formed of a semiconductor such as silicon, gallium or otherwise. The upper surface of the wafer WF is coated with a suitable resist material which has a sensitivity to the electron beam. Reference characters CP1-CPn denote plural different exposure regions each corresponding to a portion of the wafer which is going to be formed into one chip as a result of the dicing to be made after completion of the pattern drawing. Reference characters M1-M8 denote prealignment marks or fine alignment marks, respectively, which are formed on the wafer WF. Electron beam producing head MB is mounted on a stage MS and supported thereby. The alignment marks M1-M8 are formed on the wafer during the first pattern drawing process and by use of the electron beams supplied from the electron beam head MB. The stage MS is provided with actuators such as, for example, piezoelectric devices Px, Py and P$\theta$, so that it is displaceable by a minute amount in each of the X, Y and $\theta$ (rotational) directions. The piezoelectric devices Px, Py and P$\theta$ can be used for the alignment of the electron beam head with the wafer WF.

Further, the electron beam head MB is provided with a plurality of electron beam producing sources ES0–ES15. In this embodiment, each electron beam producing source comprises such a source as having the structure and function which will be described later with reference to FIG. 2. Alternatively, each electron beam producing source may comprise an electron emitting element of the type, as described, wherein a cold cathode is used to emit electrons.

The electron beam producing sources ES0 and ES15 are provided to be exclusively used for the alignment. The electron beam producing sources ES1–ES14 are provided to be exclusively used for the exposure or, alternatively, they may be used also for the alignment purpose. In this embodiment, the exposing electron beam producing sources ES1–ES14 are used in pairs, each pair undertaking the pattern drawing with respect to each of the chips in one array extending in the X direction. For example, the upper half CP1U of the chip (exposure region) CP1 is subjected to the pattern drawing by means of the electron beam producing source ES1, while the lower half CP1L is subjected to the pattern drawing by means of the electron beam producing source ES2. Similarly, with regard to the exposure regions CP2-CP5, each upper half is subjected to the pattern drawing by use of the electron beam producing source ES1, while each lower half is subjected to the pattern drawing by use of the electron beam producing source ES2. Each of the electron beam producing sources ES0-ES15 is provided with deflecting electrodes X1, X2, Y1 and Y2 for deflecting the emitted electron beam in each of the X and Y directions. Further, there are provided sensors such as denoted at S1–S9. These sensors may be of the type having a sensitivity to light or to electrons.

Keyboard KB, display DP and controller CAD are usable to design a circuit pattern of one chip, the information concerning this being supplied to a one-chip pattern generator PG. In response, the pattern generator PG operates to divide the one-chip pattern drawing information into a plurality of pattern drawing information segments each related to a portion of one chip (e.g. the upper half or the lower half thereof), the divided pattern drawing information segments being supplied to half-chip memories MU and ML. These memories MU and ML are operable to supply, at the same time, the pattern drawing information to each of the electron beam producing sources ES1, ES3 and ES5–ES13 (each undertaking the pattern drawing with respect to the lower half of each chip) and to each of the electron beam producing sources ES2, ES4 and ES6–ES14 (each undertaking the pattern drawing with respect to the lower half of each chip). It should be noted that there are provided a pair of memories MU and a pair of memories ML. The paired memories may be used alternately, so that any loss in the time for the data transfer from the pattern generator PG can be avoided substantially. The design circuit pattern is divided into halves, in this embodiment. However, the circuit pattern may be divided into three or more portions. It is, of course, necessary to use memories of a number corresponding to the number of the divided portions.

In accordance with the pattern drawing information from the memory MU or ML, each electron beam producing source operates, with the aid of the deflection of an electron beam in the X direction by means of the associated X-direction deflecting electrodes X1 and X2, to effect the pattern drawing with respect to the X direction and within a range that can be covered by the electron beam deflection. At the same time, the wafer WF and the head MB are relatively and continuously moved in the Y direction, so that the pattern drawing with respect to all the picture elements in the YY direction included in each half region is accomplished. Since the movement in the Y direction is continuous, there occurs a shift in the Y direction each time the pattern drawing in the X direction is carried out for one picture element in the Y direction. The Y-direction deflecting electrodes Y1 and Y2 are used to compensate this. Additionally, while relatively and intermittently moving the wafer WF and the head MB in the X direction, the pattern drawing is repeatedly executed whereby the pattern drawing with regard to chips in one array extending in the Y direction is accomplished.

As described, the electron beam sources can operate to effect the pattern drawing, substantially simultaneously, with regard to the chips in one array (e.g. chips CP6, CP13, CP20, CP27 and CP34) of the wafer WF extending in the Y direction. Accordingly, high-speed pattern drawing is attainable.

The deflecting electrodes X1, X2, Y1 and Y2 can be used both for the initial adjustment of the axis of the electron beam and for the alignment of the electron beam with the wafer or the chip. For example, the positions of alignment marks M4 and M5 of the chip CP1 may be detected by the sensors S4 and S5 and, on the basis of the detected positional information, the deflecting electrodes X1, X2, Y1 and Y2 of each of the electron beam sources ES1 and ES2 may be actuated to change the position of irradiation of the electron beam upon the wafer. As for the chip alignment marks, one and the same mark (such as a mark M6) may be provided for two chips (such as chips CP6 and CP13).

As for the prealignment marks, on the other hand, there are provided marks such as denoted at M1, M2, M7 and M8. For example, the position of the mark M1 may be detected by the sensor S1, while the position of the mark M2 may be detected by another sensor (not shown). On the basis of the result of detection, the initial positional adjustment of the head MB may be carried out by means of the piezoelectric devices Px, Py and P$\theta$. Then, the chip alignment mark M3, the sensor S3 and otherwise are used to measure the positional deviation and, on the basis of the result of measurement, the electron beam irradiating position is corrected by use of the deflecting electrodes X1, X2, Y1 and Y2. After this is accomplished, the pattern drawing is started. In the course of the pattern drawing operation, the operation may be temporarily stopped and alignment may be made again by use of marks M7 and M8.

The dimension of each chip on a wafer may be changed as a result of the change in shape of the wafer which might be caused by temperature change, the heat treatment of the wafer or otherwise. If the size of the chip on the wafer changes, there occurs an error or difference between the actual chip size and the electron beam pattern drawing range within which the pattern drawing should be made in accordance with the preset circuit pattern data. If such an error or difference occurs, it is not possible to draw a desired circuit pattern correctly in each chip.

Such an inconvenience can be solved by the present invention. Namely, any change (the amount of change) in the size of each of the chips on the wafer, resulting from the change in shape of the wafer, can be determined by detecting the change in the coordinate system position of an alignment mark corresponding to that chip. More specifically, with regard to the Y direction, the sensors or detectors for detecting the alignment marks are always held in a fixed positional relationship, as shown in FIG. 1. Therefore, any change in the alignment mark position as assumed at the current exposure process as compared with that as assumed at the preceding exposure process, can be detected from the change in the relative position of the mark with regard to the corresponding detector.

With regard to the X direction, the error can be detected on the basis of any change in the interval between the alignment marks of adjacent chips in an array extending in the X direction.

A series of operations described above are made under the influence of the controller CAD shown in FIG. 1, the sequence being preparatorily stored as software into the controller CAD.

In accordance with the thus detected change in the size of each chip, the electron beam irradiating position on the wafer is corrected. More particularly, in consideration of the amount of change described above and the moving speed of the wafer WF, the axis of an electron beam emitted from a corresponding electron beam source is deflected by use of deflecting electrodes X1, X2, Y1 and Y2 so as to change the beam irradiating position.

The mark detection on these occasions is attainable in various ways. For example, the reflected electron detecting system or the secondary electron detecting system, both of which are well known in the art, may be used. Namely, an electron beam may be projected, e.g., from the electron beam source ES0 toward the mark M7, and reflected electrons and/or secondary electrons caused as a result of the electron beam irradiation may be detected by the sensor S7. By this, the position of the mark 7 can be detected. As for such a sensor 7, a p-n junction of a semiconductor, for example, is usable.

It should be noted that, in a case of mark detection using an electron beam, it is necessary to set the intensity of the electron beam and the time for the electron beam irradiation so as not to obstruct the mark reading.

If it is desired to detect plural marks at one time, it is preferable to irradiate the marks with an electron beam at different timings so that these marks are detected at different timings. By doing so, the irradiation of a mark with an electron beam can be easily discriminated from the irradiation of another mark with an electron beam and, therefore, the plural marks can be detected by use of a single signal processing means.

FIG. 2A is a fragmentary bottom view showing an example of an electron beam emitting head MB which is usable in the FIG. 1 embodiment. In FIG. 2A, one electron beam emitting source, namely one electron emitting element, is illustrated. FIGS. 2B and 2C are sectional views, respectively, taken on a line B—B and a line C—C in FIG. 2A, respectively.

In FIGS. 2A-2C, reference character GL denotes an insulative base plate which is formed of, for example, glass, ceramics, crystal or otherwise. On the lower surface of the base plate GL, a number of electron beam emitting sources, each being of the surface conduction type are provided and disposed in an array extending in the direction of the line B—B in FIG. 2A. Each electron beam emitting source includes a high-resistance thin film RS and electrodes D1 and D2 which are formed on the lower surface of the base plate GL. The high-resistance thin film RS can be formed, for example, by electrically energizing, under a high temperature, a metal thin film such as Pt, Au, Mo, C, Pd or otherwise or a metallic oxide thin film such as $SnO_2$, $In_2O_3$, TiO or otherwise, to thereby cause breaking of the film structure. The thickness of the high-resistance thin film RS is, for example, of an order of 100-10000 Angstroms, and its resistance is, for example, of an order of several kiloohms to several hundreds megaohms. As illustrated in the drawings, the electrodes D1 and D2 are connected to the opposite ends of the high-resistance thin film RS in the direction of the line C—C in FIG. 2A. Each of the electrodes D1 and D2 may comprise an ordinary thin film electrode made of, for example, a metal such as Pt, Au, Ag or otherwise.

On the lower surface of the base plate GL, there is formed an electrically insulating layer IS which is provided to cover the base plate GL as well as the electrodes D1 and D2, except for the portion below the high-resistance thin film RS. The insulating layer may be made of, for example, $SiO_2$, SiN, $Si_3N_4$, AlN, BN or otherwise. On the lower surface of the insulating layer IS, there is provided a pair of deflecting electrodes X1 and X2 and another pair of deflecting electrodes Y1 and Y2 which are extending in parallel to the direction of line B—B and the direction of line C—C with regard to the high-resistance thin film RS. Each of these deflecting electrodes may be made of a similar material as that of the electrode D1 or D2.

Denoted at S9 and S10 (FIG. 2B) are the photosensors or electron sensors as described hereinbefore. An additional pair of sensors may be provided in the Y direction. Alternatively, a plurality of sensors may be disposed in a ring-like fashion. In any case, the provision of sensors as a unit with an electron beam producing source assures that the sensors and the electron beam producing source are held in a fixed positional relationship, thus assuring improvements in the detection accuracy. Where photosensors are used, preferably an alignment light source LP may be incorporated into the head MB, as illustrated in FIG. 2C. Where a solid state element such as a light emitting diode or otherwise is used as the lamp LP, it can be formed simultaneously with the formation of the electron beam source, the sensors and the like, by means of the semiconductor manufacturing technology or the thick/thin film manufacturing techniques.

On an occasion where an ultraviolet light source or a deep UV light source is used as the light source LP, it can be used also for the excitation of a resist WR applied to the wafer WF surface. If the excitation is effected prior to the electron beam exposure, a thin unsolubility layer is formed on the surface of the resist WR, the unsolubility property of such a layer being increased as a result of the electron beam exposure. Accordingly, by doing so, it is possible to increase the ratio of the film thickness to the width of a line drawn on the wafer. As a result, the sensitivity or resolution (aspect ratio) can be improved. This is desirable. As for the resist WR material, a material "RD2000N" (trade name) manufactured by Hitachi Kasei Kogyo, Japan, for example, may be used. The provision of the light source LP within the structure of the head MB provides an advantage of allowing preparatory exposure at the time of relative movement of the head to the wafer WF.

Additionally, the light from the deep UV light source LP may be projected upon the thin film RS (electron emitting portion) at the time of exposure. By doing so, the number of emitted electrons increases. This is desirable. Further, where a light source providing a visible light is used as the light source LP, the formation of the thin film RS by use of a so-called photocathode material can provide substantially the same effects. As for such a photocathode material, various materials are usable. Examples are: a material comprising a compound of alkaline metal with Ag, Bi or Sb; a silver-cesium material; an antimony-cesium material; a bismuth-cesium material; a multi-alkaline material (a compound of alkaline metals), and so on.

Each electron beam producing source may be formed by a semiconductive member such as disclosed in U.S. Pat. No. 4,259,678 or Japanese Laid-Open Patent Application, Laid-Open No. Sho54-111272. Also, the light from the light source LP may be projected upon the thin film RS only when such a pattern as having a relatively wide linewidth is going to be drawn.

As described above, these electron beam producing sources can be easily provided on the base plate by means of the semiconductor manufacturing technology, and each electron beam producing source can be made compact.

FIG. 3 is a fragmentary view showing another example of an electron beam head which is usable in the electron beam pattern drawing apparatus of the FIG. 1 embodiment.

In the electron beam head of the FIG. 3 example, each pair of electron beam producing sources such as at ES1 and ES2, are provided as a "unit" beam producing source means.

Usually, an electron beam producing source means is disposed in a vacuum ambience in order to increase the electron emission efficiency and to prevent undesirable attenuation of the emitted electrons. In this example, the electron beam producing source means can be surrounded by a plurality of vacuum partition chambers so that it can be substantially isolated from the atmosphere surrounding it. With this arrangement, a large amount of electrons can be emitted only with a low-voltage drive. Also in this case, the additional light projection as described hereinbefore assures improved efficiency. Further, only a single electron beam source may be used to draw a line of a narrow width, while plural electron beam sources may be used to draw a line of a relatively wide width. This is effective to improve the pattern drawing speed.

Also, a focusing lens such as at FC and a deflecting electrode such as at AD may be provided.

In the structure shown in FIG. 3, a plurality of partition wall members such as at V1, V2 and V3 are used to define a plurality of partition chambers. Further, means may be provided to establish in these chambers different degrees of vacuum, the degree of vacuum decreasing in order from the first chamber to the third chamber. This arrangement is effective to isolate the electron beam producing means from the atmosphere, without making the structure large in size. Further, this allows use of a vacuum chuck VC for holding the wafer WF by vacuum attraction. In this example, sensors S11 and S12 may be mounted to the bottom surface of the partition wall member V1, for example.

FIG. 4 is a fragmentary section showing another example of an electron beam emitting head usable in the FIG. 1 embodiment. In the FIG. 4 example, reference character BG denotes an electron beam emitting source of the type described hereinbefore. Also, as described in the foregoing, an electron beam EB is emitted from the source BG toward a wafer mark WM. As the wafer mark WM is irradiated with the electron beam EB, secondary electrons and/or reflected electrons as denoted at 2E in FIG. 1 are produced from the wafer WF. These secondary electrons or reflected electrons are received by one or more sensors PN, such as a p-n junction, for example, which are formed on the base member MB as a unit therewith. By this, the wafer mark WM is detected.

Preferably, the position of the sensor on the base member MB is such that the sensor can efficiently detect secondary electrons or reflected electrons 2E. Moreover, in the present embodiment, ring-like electrodes C1 and C2 are mounted on the base member MB side in order to further improve the efficiency of the electron detection. Additionally, an electric voltage Vex is applied between the electrode C1 and the electron beam producing source BG; an electric voltage Vd is applied to the electrode C2; and an electric voltage Vc is applied between the electron beam producing means BG and the wafer WF, as illustrated in FIG. 4.

Accordingly, when electric voltages (for example, Vex=10-100 V; Vc=1-10 KV; and Vd=100 V) are applied, secondary electrons or reflected electrons 2E are efficiently collected and detected by the p-n junction sensor PN.

Figure 5:
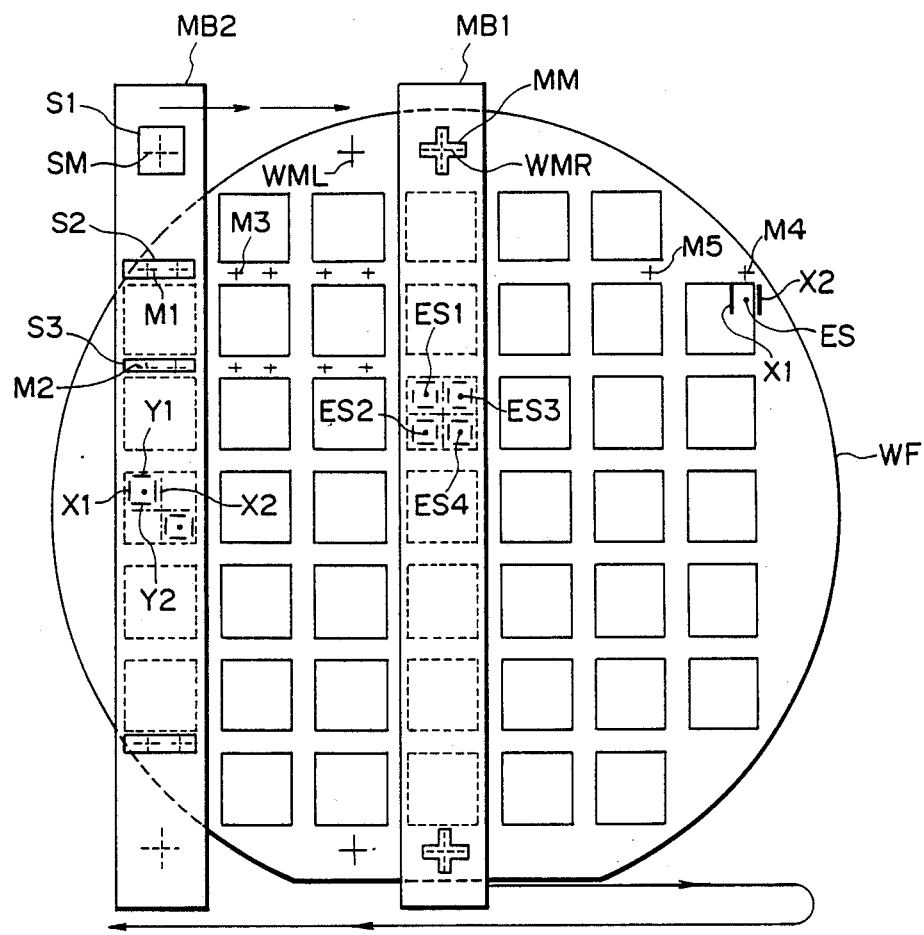
FIG. 5 is a schematic view of an electron beam apparatus according to a second embodiment of the present invention.

FIG. 5 shows an electron beam pattern drawing apparatus according to another embodiment of the present invention, which embodiment is a modified form of the FIG. 1 embodiment.

In FIG. 5, an electron beam head MB1 is provided with plural sets of electron beam sources, each set comprising four electron beam sources such as ES1-ES4 and corresponding to one chip. Each electron beam source is provided with X-Y deflecting electrode means, similar to that used in the FIG. 1 embodiment. Thus, in the present embodiment, patterns can be drawn on the four quadrant regions of each of the chips included in an array, at the same time and with the aid of the X-Y deflecting electrode means, in accordance with essentially the same principle as the FIG. 1 example. This ensures further improvement in the pattern drawing speed.

Further, the head MB1 is formed with alignment marks MM, these marks being aligned in a later stage with wafer alignment marks WMR, provided on the wafer, by use of light projection.

First, after completion of such alignment, patterns are drawn upon all the chips in the array extending in the Y direction and positioned at this time just below the head MB1. With regard to the chips of the other arrays, subsequently the head and the wafer are moved relatively and intermittently (step-by-step) and a similar alignment operation and the pattern drawing operation are repeated.

Since, however, usually a wafer WF has a circular shape, it is possible that the wafer alignment marks WMR are not formed for each of the chip arrays in the Y direction. In such a case, first the electron beam head may be aligned with only one array at the central portion of the wafer and, once this is achieved, the succeeding exposures may be made without any feedback. Alternatively, the electron beam head may be aligned first by use of alignment marks WMR formed at the central portion of the wafer WF and, thereafter, the pattern drawing (exposure) is made in the sequence from the left to the right in FIG. 5. At the time when the exposures of the right half of the wafer are completed, the electron beam head may be reversed leftwardly and, after completing again the alignment using the marks WMR again or using alignment marks WML formed at portions of the wafer which are unexposed, the exposures of the remaining portions of the left half of the wafer may be made.

Only for explanation of another alignment and exposure method which can be used in the present embodiment, another electron beam head is additionally illustrated in FIG. 5 as denoted by reference character MB2.

In this case, the head MB2 is initially positioned at the leftward end portion of the wafer WF. First, a mark SM provided on a wafer stage is detected by use of a sensor S1 and, on the basis of which, the prealignment is carried out. Subsequently, in the prealigned state, marks M1 and M2 and sensors S2 and S3 are used to measure the amount of positional deviation. Then, at the time of exposure, the electron beam irradiation is effected with the compensation of the detected positional deviation by using both or one of the X and Y deflecting electrodes. For the next array, first, marks M3 are used in a similar manner and any positional deviation is measured. On the basis of the result of measurement, exposures are made. For the subsequent array, similarly, the measurement of positional deviation and exposures are made. However, before conducting the measurement and the exposure, marks WML may be used to effect, again, the prealignment.

It is possible that a mark M4 is used for measurement of the positional deviation of the electron beam head positioned to be opposed to the array having the mark M4; in that position, the head operates to effect exposures of those regions which are being covered by the electron beam sources ES and the deflecting electrodes Xl and X2; thereafter, while continuously moving the head or the wafer, the exposure is effected; after the exposure of the chips on that array are completed, the head or the wafer is stopped at the mark M5 position; and then the above-described operations are repeated. This corresponds to an intermediate of the step-and-repeat exposure and the step-and-scan exposure.

Figure 6A:
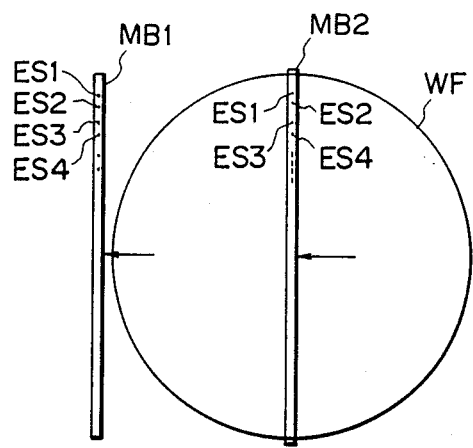
FIGS. 6A-6D are schematic views, respectively, showing third, fourth, fifth and sixth embodiments of the present invention, respectively.

FIGS. 6A-6D show further embodiments of the present invention which correspond to modified forms of the apparatus of the FIG. 1 embodiment, respectively. FIG. 6A shows an example wherein there are provided plural electron beam heads MB1 and MB2 which are adapted to undertake the pattern drawing to the left half and the right half of a wafer WF, respectively. This arrangement permits further improvement of the throughput.

Figure 6C:
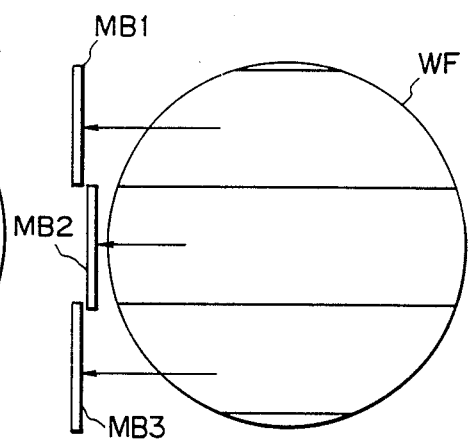
Figures 6B, 6D:
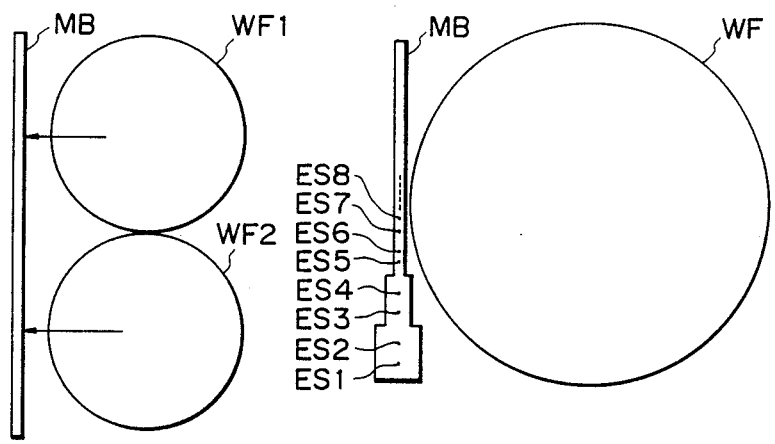

FIG. 6B shows an example wherein smaller-diameter wafers WF1 and WF2 are subjected at once to the exposure using a single electron beam head MB. Also in this example, the throughput can be improved significantly.

FIG. 6C shows an example wherein a plurality of electron beam heads MB1, MB2 and MB3 each having a short length are disposed along the Y direction. This example can suitably meet a case where the manufacture of a long head is difficult or a case where a large-diameter wafer having a diameter not less than 8 inches is to be used. As described hereinbefore, usually the end portion of an electron beam head is provided with an alignment mark detecting portion or it is provided with a reinforcing structure. Accordingly, in this example, the plural electron beam heads MB1-MB3 should preferably be disposed in a staggered relation as illustrated.

FIG. 6D shows an example wherein a plurality of electron beam sources are formed on a single head MB and wherein these electron beam sources are arranged to emit electron beams of different beam diameters. More specifically, the electron beam sources ES1 and ES2 have a large size diameter; the electron beam sources ES3 and ES4 have a middle-size diameter; and the electron beam sources ES5-ES8 . . . have a small-size diameter. Usually, first, the electron beam sources ES5-ES8 . . . are used so that pattern portions except for those portions having a middle linewidth and a wide linewidth, are drawn on the wafer. Thereafter, by using the electron beam sources ES4, ES2 or otherwise, the pattern portions having a middle linewidth or a wide linewidth are drawn on the wafer. At this time, the head or the wafer is moved to allow the pattern portions having a line width corresponding to the used electron beam source to be drawn on each chip.

Figure 7:
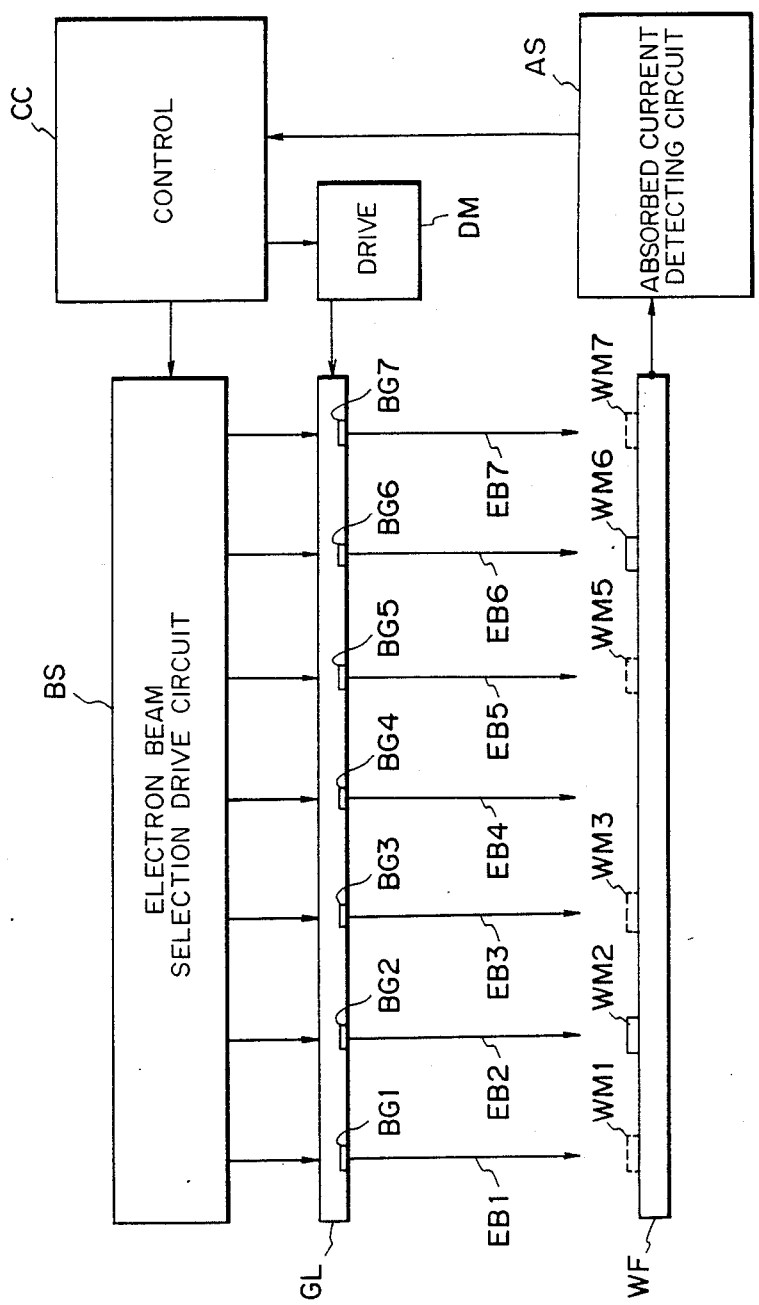
FIG. 7 is a schematic and diagrammatic view for explaining selective use of electron beam sources in a case where an electron beam head of the type as employed in the FIG. 1 embodiment, for example, is used.

FIG. 7 is a schematic view for explaining the selective use of electron beam sources, according to another aspect of the present invention. The electron beam emitting head shown in FIG. 7 is so arranged that a wafer mark is not detected by a sensor provided on the head side, but is detected on the basis of the magnitude of electric current absorbed by wafer WF.

In FIG. 7, reference character WF denotes a wafer which contains a semiconductive material. A plurality of electron beam producing sources BG1-BG7 adapted to produce electron beams EB1-EB7 are formed on a single and common base plate GL, which may be made of a glass material, a semiconductive material or otherwise such as disclosed, for example, in Japanese Laid-Open Patent Applications, Laid-Open Nos. Sho54-111272 and Sho56-15529. Additionally, there are provided a selection and driving circuit BS which is provided to selectively drive the electron beam producing sources BG1-BG7; a controller CC provided to control the apparatus as a whole; and an absorbed current detecting circuit AS adapted to detect the absorbed electric current which is caused as a result of the irradiation of an electron beam detecting an alignment mark on the wafer WF. The alignment mark can be detected by scanning the mark on the wafer with an electron beam and by detecting any change in the absorbed electric current, which change is caused with the change in the surface configuration at the mark portion of the wafer. An electron lens means, a deflecting electrode or a blanking electrode, having been described with reference to FIGS. 2 and 3, may be provided, if necessary.

In the described structure, if alignment marks are provided on the wafer WF at the positions as denoted by solid lines WM2 and WM6, respectively, the actual circuit device pattern should locate in the inside region between these marks WM2 and MW6. Accordingly, in such a case, the electron beams EB3, EB4 and EB5 are selected for the drawing of the actual circuit device pattern, while the electron beams EB2 and EB6 are selected for the detection of the alignment marks. The selection is made at the selecting circuit BS. The selection is made in accordance with preset data which is determined on the basis of the positional relationship between the base plate GL and the wafer WF, the data being stored in the controller CC. The selected electron beam producing sources are selectively controlled for the alignment purpose and the pattern drawing purpose, respectively, by means of the selection and driving circuit BS and the controller CC.

In operation, the electron beams EB2 and EB6 are emitted toward the marks, whereby electrons are absorbed by the wafer WF. The magnitude of the absorbed electric current is detected by the current detecting circuit AS, whereby the positions of the marks WM2 and WM6 can be determined. It should be noted however that, as described in the foregoing, it is desirable to produce the electron beams EB2 and EB6 at different timings so that the mark detection signals can be discriminated from each other. On the basis of the mark detection, the wafer WF is aligned with the aid of the driving portion DM. Thereafter, the electron beams EB3-EB5 are used to draw the circuit pattern in the manner as has been described with reference to FIG. 1 or FIG. 5.

If, on the other hand, the alignment marks are at the positions shown by broken lines WM3 and WM5, the electron beams EB3 and EB5 are used for the alignment purpose, while the electron beam EB4 and/or the electron beams EB1, EB2, EB6 and EB7 are used for the exposure purpose. Also, if the alignment marks are at positions shown by broken lines WM1 and WM7, the electron beams EB1 and EB7 are used for the alignment, while the electron beams EB2-EB6 are used for the exposure. However, it is to be noted that the electron beam sources can be selected somewhat freely. For example, while in the present embodiment, the electron beam source BG6 is selected as an alignment scope beam irradiating source when the alignment mark WM6 is used, the selection of the source BG6 is not limiting. Namely, an adjacent electron beam source BG5 or BG7 may be selected.

It should be noted that the present invention is applicable not only to the printing (drawing) of a semiconductor circuit pattern using an electron beam, but also to the data writing upon a recording member which uses an electron-beam sensitive medium. Also, the present invention is applicable to the reading of such data when the invention is used in combination with a charged-particle sensor.

More particularly, for example, the present invention is applicable to the recording or tracking in the field of a magneto-optic recording medium such as an optical disk or an optical card, or a microfilm, and in such a case, the electron beam head of the present invention is selectively usable for the data writing and the data reading.

Further, the electron beam head of the present invention is applicable to an electron-beam probe tester for the examination of the function of semiconductor devices. In such a case, an appropriate electron beam producing source may be selected in accordance with the size of a semiconductor chip or with the point of measurement. At this time, the remainder other than the electron beam producing source selected for the measurement may be kept in a state wherein production of signals is inhibited.

Where the electron beam head of the present invention is incorporated in a particular apparatus for plural uses, the output energy of the electron beam head as a whole may be variably controlled for each use. Further, the output energy of each electron beam producing source may be variably controlled. This is easily attainable and may be preferably incorporated into the embodiments described hereinbefore.

The present invention, as has hitherto been described, provides various advantageous effects.

Examples are as follows:

(1) Use of plural charged-particle beam sources for the exposure of a workpiece assures high-speed processing of a workpiece.

(2) Exact positioning of plural charged-particle beam producing sources is effective to avoid the problems of heat generation, interference of beams and so on. Also, the minimization of the heat generation is effective to improve the durability of the apparatus.

(3) Electron sources and other components can be provided on a single base member as a unit therewith. This is very effective to reduce the size of the apparatus as well as to assure improved precision of the apparatus.

(4) The drawing (irradiating) pattern data can be transferred, without interruption, to the charged-particle beam producing sources by alternately using plural buffers. This permits further improvement of the processing speed.

(5) When a plurality of beam producing units each having plural charged-particle beam producing sources disposed on a common plate, are used and disposed in a juxtaposed region, further improvement in the processing speed is attainable.

(6) When plural beam producing units each having plural beam producing sources disposed on a common plate, are used and disposed in series, further improvement in the processing speed is attainable even when a large-size workpiece is to be processed.

(7) When a sensitive member is preparatorily irradiated with ultraviolet light or otherwise, the aspect ratio of a pattern drawn on the sensitive member or the information written on the sensitive member can be increased significantly.

(8) Upon emission of ah electron beam, the electron beam emitting portion of the electron beam producing source may be irradiated with ultraviolet light or otherwise. This increases the efficiency of electron beam emission. Also, this is usable to adjust the beam intensity.

(9) One charged-particle beam producing source is constituted by plural charged-particle beam emitting portions. This assures that a large amount of electrons are emitted, even with a low-voltage drive. Also, the beam intensity can be adjusted easily. Thus, for example, the beam intensity can be adjusted variably to meet the drawing of narrow lines and wide lines. This is effective to increase the pattern drawing speed.

(10) The charged-particle beam producing source may be provided with vacuum intercepting wall means. This allows the apparatus to be placed in an atmosphere. Therefore, a vacuum chuck, for example, may be used for holding a workpiece by vacuum attraction. Further, when sensors or otherwise are disposed in a high-vacuum portion, the problem of contamination or otherwise can be avoided.

(11) Different types of charged-particle beam producing sources, adapted to produce charged-particle beams of different beam diameters, may be used. If this is done, these beam producing sources may be selectively used in accordance with the beam size as required.

(12) Each charged-particle beam producing source is provided with a deflecting means, with the result that, even in a stationary state, a large area of a workpiece can be irradiated with the charged-particle beam. Also, the beam irradiating direction can be adjusted easily and precisely.

(13) Alignment marks may be detected by use of charged-particle beams emitted in a time series manner. This enables alignment, while precluding affects of interference between the charged-particle beams. Also, the detecting beams can be discriminated from each other, easily.

(14) Detecting means for detecting a charged-particle beam or secondary electrons (or reflected electrons), caused by the irradiation of the charged-particle beam may be provided. If this is done, the alignment is attainable without using an additional light source and a photodetecting means related thereto. Thus, the structure of the apparatus can be made simple and compact.

While the invention has been described with reference to the structures disclosed herein, it is not confined to the details set forth and this application is intended to cover such modifications or changes as may come within the purposes of the improvements or the scope of the following claims.

What is claimed is:

1. A charged-particle beam apparatus for forming patterns on a semiconductor wafer for use in the manufacture of microcircuit devices, said apparatus comprising:

beam source means comprising a plurality of charged-particle beam sources;

actuating means operable to selectively actuate said charged-particle beam sources; and control means operable to control said actuating means so that separate zones of the semiconductor wafer are simultaneously irradiated with charged-particle beams from different charged-particle beam sources and so that different regions of each zone of the semiconductor wafer are irradiated with charged-particle beams from plural charged-particle beam sources, whereby plural patterns are formed substantially at the same time in the separate zones.

2. An apparatus according to claim 1, wherein each zone of the semiconductor wafer is irradiated with charged-particle beams from plural charged-particle beam sources of a number corresponding to the number of regions defined in each zone.

3. An apparatus according to claim 1, wherein said charged-particle beam sources are disposed in an array and wherein means are provided for relatively moving said beam sources and the semiconductor wafer so that all of the zones of the semiconductor wafer are scanned with corresponding charged-particle beams from said charged-particle beam sources.

4. An apparatus according to claim 1, wherein each charged-particle beam source comprises an electron emitting element having an avalanche effect.

5. An apparatus according to claim 1, further comprising deflecting means for deflecting charged-particle beams from said charged-particle beam sources, independently of each other.

6. An apparatus according to claim 1, further comprising a detector for detecting charged particles from the semiconductor wafer as the semiconductor wafer is irradiated with a charged-particle beam from a charged-particle beam source.

7. An apparatus according to claim 6, wherein said detector comprises means for detecting secondary charged particles from the semiconductor wafer.

8. An apparatus according to claim 6, wherein said detector comprises means for detecting reflected charged particles from the semiconductor wafer.

* * * * *

UNITED STATES PATENT AND TRADEMARK OFFICE
CERTIFICATE OF CORRECTION

PATENT NO. : 4,897,552

DATED : January 30, 1990

INVENTOR(S) : Masahiko Okunuki, et al.

It is certified that error appears in the above-identified patent and that said Letters Patent is hereby corrected as shown below:

IN THE ABSTRACT OF THE DISCLOSURE

Line 12

"source," should read --sources--.

IN THE DISCLOSURE

COLUMN 2

Line 34, "abovedescribed" should read --above-described--.

UNITED STATES PATENT AND TRADEMARK OFFICE
CERTIFICATE OF CORRECTION

PATENT NO. : 4,897,552

DATED : January 30, 1990

INVENTOR(S) : Masahiko Okunuki, er al.

It is certified that error appears in the above-identified patent and that said Letters Patent is hereby corrected as shown below:

COLUMN 5

Line 40, "YY direc-" should read --Y direc- --.

COLUMN 13

Line 66, "ah" should read --an--.

Signed and Sealed this

Second Day of July, 1991

*Attest:*

HARRY F. MANBECK, JR.

*Attesting Officer*     *Commissioner of Patents and Trademarks*